(12) United States Patent
Edo et al.

(10) Patent No.: US 8,018,311 B2
(45) Date of Patent: Sep. 13, 2011

(54) MICROMINIATURE POWER CONVERTER

(75) Inventors: Masaharu Edo, Tokorozawa (JP);
Takayuki Hirose, Sagamihara (JP)

(73) Assignee: Fuji Electric Systems Co., Ltd, Tokyo (JP)

( * ) Notice: Subject to any disclaimer, the term of this patent is extended or adjusted under 35 U.S.C. 154(b) by 388 days.

(21) Appl. No.: 11/972,609

(22) Filed: Jan. 10, 2008

(65) Prior Publication Data

US 2008/0169896 A1    Jul. 17, 2008

(30) Foreign Application Priority Data

Jan. 11, 2007 (JP) .................................. 2007-002966

(51) Int. Cl.
*H01F 5/00* (2006.01)

(52) U.S. Cl. ................ 336/200; 336/223; 336/232

(58) Field of Classification Search .............. 336/200, 336/232, 223
See application file for complete search history.

(56) References Cited

U.S. PATENT DOCUMENTS

| | | | | |
|---|---|---|---|---|
| 4,910,394 | A * | 3/1990 | Ohta ............................ | 235/492 |
| 5,699,241 | A * | 12/1997 | Fujikawa ...................... | 363/144 |
| 6,704,203 | B2 * | 3/2004 | Chapuis et al. .............. | 361/719 |
| 6,777,818 | B2 * | 8/2004 | Baldwin ....................... | 257/795 |
| 6,835,576 | B2 * | 12/2004 | Matsuzaki et al. ............ | 438/3 |
| 6,930,584 | B2 | 8/2005 | Edo et al. | |
| 6,976,300 | B2 * | 12/2005 | Ahn et al. ...................... | 29/604 |
| 7,307,341 | B2 * | 12/2007 | Humbert et al. .............. | 257/728 |
| 7,333,786 | B2 * | 2/2008 | Kikuchi et al. ............... | 455/130 |
| 7,365,628 | B2 * | 4/2008 | Sato et al. ..................... | 336/200 |
| 7,432,580 | B2 * | 10/2008 | Sato et al. ..................... | 257/516 |
| 7,710,738 | B2 * | 5/2010 | Miura ........................... | 361/760 |
| 7,851,257 | B2 * | 12/2010 | Marimuthu et al. .......... | 438/108 |
| 2004/0208032 | A1 | 10/2004 | Edo et al. | |
| 2007/0035020 | A1 * | 2/2007 | Umemoto ..................... | 257/737 |
| 2007/0213776 | A1 * | 9/2007 | Brink ............................ | 607/7 |

FOREIGN PATENT DOCUMENTS

| | | |
|---|---|---|
| JP | 2001-196542 | 7/2001 |
| JP | 2002-233140 | 8/2002 |
| JP | 2002-353030 A | 12/2002 |
| JP | 2004-274004 | 9/2004 |
| JP | 2005-183890 | 7/2005 |

\* cited by examiner

*Primary Examiner* — Anh T Mai
*Assistant Examiner* — Joselito Baisa
(74) *Attorney, Agent, or Firm* — Rabin & Berdo, P.C.

(57) ABSTRACT

A microminiature power converter includes a semiconductor substrate on which a semiconductor integrated circuit is formed, and a thin magnetic induction element. The magnetic induction element includes a magnetic insulating substrate having first and second principal planes and a plurality of through-holes. A coil is formed on a central region of the magnetic insulating substrate, and electrodes are formed on the first and second principal planes at peripheral regions of the magnetic insulating substrate, and electrically connected to the magnetic insulating substrate via respective through-holes. Wiring is formed on the first principal plane in the central region of the magnetic insulating substrate and connected to a capacitor. One end of the wiring is connected to one of the electrode electrodes, and an insulator layer is provided between the wiring and the coil.

8 Claims, 9 Drawing Sheets

MICROMINIATURE POWER CONVERTER

CROSS-REFERENCE TO RELATED APPLICATION

This application is based on, and claims priority from, Japanese Patent Application No. 2007-002966, filed on Jan. 11, 2007, the contents of which are incorporated herein by reference.

BACKGROUND OF THE INVENTION

1. Field of the Invention

The present invention relates to a microminiaturemicrominiature power converter, such as a DC-DC converter, composed of a semiconductor element (an electronic component) such as a semiconductor integrated circuit (hereinafter referred to as an IC) and passive components such as a coil, a capacitor, and a resistor.

2. Description of the Related Art

Recently, electronic information equipment, various types of mobile electronic information equipment in particular, have become remarkably widespread. Most of these types of electronic information equipment have batteries for power supply and contain a power converter such as a DC-DC converter. The power converter is generally constructed as a hybrid power supply module in which discrete parts of active components such as switching elements, rectifiers, and control ICs, and passive components such as magnetic parts, capacitors, and resistors, are packaged on a ceramic board or a plastic printed circuit board.

With the current demand for a reduction in size, thickness and weight of various types of electronic information equipment including the mobile ones, the need for built-in power converters having a reduced size, thickness and weight is correspondingly urgent. Miniaturization of the hybrid power supply module has been achieved by an MCM (multi chip module) technique and by a technique in which laminated ceramic parts are used. However, since discrete parts are packaged and arranged on one and the same substrate, the reduction possible in packaging area of the power supply module is limited. Particularly since a magnetic part, such as an inductor or a transformer, has a very large volume as compared with an integrated circuit, the size of the magnetic part constitutes the most critical limitation restricting the reduction in size and thickness of electronic equipment.

For reduction in size and thickness of a magnetic part, two approaches are conceivable. In one approach, the magnetic part is made as small and thin as possible and packaged on a planar board; in the second approach, the magnetic part is made in a configuration of a thin film and mounted on a silicon substrate. An example has been reported recently in which a thin micro-magnetic element (coil, transformer) is mounted on a semiconductor substrate by applying semiconductor technology. In particular, a planar magnetic part (a thin inductor) formed by using a thin film technology has been disclosed (see, for example, Japanese Unexamined Patent Application Publication No. 2001-196542) in which a thin film coil is sandwiched by a magnetic substrate and a ferrite substrate, and formed on a surface of a semiconductor substrate in which semiconductor parts, such as a switching element and a control circuit, are formed.

The foregoing structure has made it possible to reduce the thickness and packaging area of the magnetic element. This structure, however, requires a vacuum process, which increases manufacturing costs. In addition, it needs extensive steps for laminating a multiple of magnetic films and insulator films, especially when use at a high electric current is contemplated, which significantly increases costs.

A type of a planar magnetic element has been disclosed (see, for example, Japanese Unexamined Patent Application Publication No. 2002-233140 (FIG. 1)) in which a resin material mixed with magnetic fine particles is filled in the gap of a spiral coil conductor, and ferrite substrates are put on upper and lower surfaces of the conductor.

In this method, since the inductance of the coil conductor is approximately proportional to the number of turns of the spiral, it is necessary to increase the number of turns for achieving a large inductance. When the number of turns is increased without increasing the packaging area, the cross-sectional area of the coil conductor must be decreased. That is, in order to obtain a large inductance, it is necessary to decrease the cross-sectional area of the coil conductor and to elongate the conductor wire length. The decreased cross-sectional area of the coil conductor and the elongated conductor wire length bring about an increase in DC resistance of the coil conductor and an increase in power loss.

In order to solve this problem, a thin magnetic element has been disclosed (see, for example, Japanese Unexamined Patent Application Publication No. 2004-274004 and corresponding U.S. Pat. No. 6,930,584 and Chinese Patent Application Publication No. CN 1525631 A) that comprises a magnetic insulating substrate, and a solenoid coil conductor in which are connected a first conductor formed on a first principal plane of the magnetic insulating substrate, a second conductor formed on a second principal plane of the magnetic insulating substrate, and a connection conductor formed in a through-hole passing through the magnetic insulating substrate.

The foregoing structure provides a microminiaturemicrominiature, thin power converter in which terminals for connection to a semiconductor element and a circuit board can be formed at the same time in the process for forming the through-holes and the coil conductors on the magnetic insulating substrate. Then, the IC chip only needs to be mounted on the magnetic insulating substrate for forming the coil, thus eliminating necessity for a separate packaging substrate.

The microminiature power converter disclosed in Japanese Unexamined Patent Application Publication No. 2004-274004 features a power converter comprising a thin magnetic induction element that includes a through-hole formed in a magnetic insulating substrate, coil conductors electrically connected through the through-hole and formed on the first principal plane and the second principal plane, and further electrodes (connection terminals) formed on the first principal plane for electrical connection to the semiconductor element, and other electrodes (packaging terminals) formed on the second principal plane for electrical connection to a printed circuit board that is used in actual operation. The proposed constitution provides a power converter with a reduced thickness while limiting the number of parts composing the converter to the minimum. This microminiature power converter is described in the following.

FIGS. 15(a) and 15(b) show a microminiature power converter of the prior art, in which FIG. 15(a) is a sectional view of a thin magnetic induction element on which is mounted an IC chip, and FIG. 15(b) is a plan view of the thin magnetic induction element seen from the side of the first principal plane (front surface). FIG. 15(a) is a sectional view taken along the line Y-Y in FIG. 15(b). In FIG. 15(b), the IC chip 80 is indicated by a dotted line.

The thin magnetic induction element 300 of the prior art includes a solenoid coil formed in a central region of a ferrite substrate 86 and electrodes 82, 88 formed in a peripheral region. The solenoid coil is composed of a coil conductor 84 (including connecting conductors) formed on the first principal plane and the second principal plane of the ferrite substrate 86 and in the through-holes 85. The electrode 82 is formed on the first principal plane and the electrode 88 is formed on the second principal plane, both electrodes being connected by a connection conductor 83a formed in the through-hole 83.

An IC chip 80 is bonded to the electrode 82 formed on the first principal plane through a stud bump 81. An under fill resin 89 is filled in the space between the IC chip 80 and the ferrite substrate 86. The coil conductor 84 formed on the second principal plane is covered by a protective film 87.

A lamination substrate, though not a microminiature power converter, has been disclosed (see, for example, Japanese Unexamined Patent Application Publication No. 2005-183890) in which a coil is internally formed of a coil conductor and a magnetic material, external electrodes for mounting a circuit component are formed on the upper surface, and a wiring pattern is internally formed for wiring the external electrodes and the coil. The lamination substrate has enhanced freedom of arrangement of circuit component to be mounted.

The structure disclosed in Japanese Unexamined Patent Application Publication No. 2004-274004 has, as shown in FIGS. 15(a) and 15(b) herein, bonding electrodes (electrodes 82) in the peripheral region of a thin magnetic induction element for bonding to IC chip 80, i.e., a semiconductor element. Since the coil of the thin magnetic induction element having the configuration of a solenoid coil must be located in the central region of the magnetic induction element, the bonding electrodes for bonding with a semiconductor element such as IC chip 80 are necessarily located in the peripheral region of the thin magnetic induction element.

Among the characteristics of a thin magnetic induction element, the inductance value largely depends on the size of the magnetic induction element. As such, element size primarily affects feasibility of necessary characteristics.

Concerning the size of a semiconductor element, however, the size can be restricted of course by the characteristics, but may be reduced in large extent depending on desired performance in some cases.

Thus, there is no intrinsic correlation between the size of a semiconductor element and the size of a thin magnetic induction element. Nevertheless, a semiconductor element is mounted on the magnetic induction element in planar configuration in the foregoing structure and electrodes 82 are arranged in the peripheral region. As such, the problem arises that the size of the semiconductor element is eventually restricted by the size of the thin magnetic induction element.

Thus, even though a semiconductor element could be minimized, if a thin magnetic induction element is not minimized, the semiconductor element must have a large size, inhibiting cost reduction.

Further, since the electrodes 82 are arranged in the peripheral region, it is difficult to package two or more semiconductor elements. Thus, the restriction arises that the number of semiconductor elements that can be packaged on one thin magnetic induction element is limited to only one. This restriction has inhibited multi-functionality of the device.

Although the lamination substrate of Japanese Unexamined Patent Application Publication No. 2005-183890 has the freedom of arrangement of parts connecting to the internally formed coil (inductor), it also has a complicated structure, which leaves the problems of cost and micro-miniaturization.

It is therefore an object of the present invention to solve the above problems and provide a microminiature power converter in which components including a semiconductor element smaller than a thin magnetic induction element can be packaged in a planar arrangement at a predetermined place on the thin magnetic induction element without restriction on positioning of the electrodes formed in the peripheral region of the thin magnetic induction element.

SUMMARY OF THE INVENTION

To achieve the above object, the present invention provides a microminiature power converter includes a semiconductor substrate having a semiconductor integrated circuit formed thereon, a thin magnetic induction element, and a capacitor. The thin magnetic induction element includes a magnetic insulating substrate, a coil formed in a central region of the magnetic insulating substrate, and electrodes formed on first and second principal planes in the peripheral regions of the magnetic insulating substrate, and electrically connected via through-holes. The microminiature power converter further includes wiring formed on the first principal plane in the central region of the magnetic insulating substrate, interposing an insulator layer between the wiring and the coil, and one end of the wiring is connected to the electrode.

Preferably, the coil is a solenoid coil in which a first conductor formed on the first principal plane of the magnetic insulating substrate, a second conductor formed on the second principal plane of the magnetic insulating substrate, and a connection conductor formed in a through-hole passing through the magnetic insulating substrate are connected.

Advantageously, the other end of the wiring is connected to at least one component including a semiconductor element.

Preferably, the magnetic insulating substrate is a ferrite substrate.

According to the invention, wiring is formed on the coil conductors composing the thin magnetic induction element and an insulator layer interposed between the wiring and the coil conductors, and connecting (fixe) to the wiring components including a semiconductor element having predetermined dimensions which are packaged in a planar configuration. The size of the components is not restricted and the cost of the components is decreased, reducing the overall cost of the microminiature power converter.

BRIEF DESCRIPTION OF THE DRAWINGS

FIGS. 1(a) and 1(b) show an essential part of a microminiature power converter of a first embodiment according to the invention, in which FIG. 1(a) is a plan view of a thin magnetic induction element seen from the first principal plane side and FIG. 1(b) is a sectional view taken along the line Y-Y in FIG. 1(a);

FIGS. 2(a) and 2(b) show an essential part of the microminiature power converter of the first embodiment according to the invention, in which FIG. 2(a) is a plan view of a thin magnetic induction element packaging a semiconductor element in a planar configuration and FIG. 2(b) is a sectional view taken along the line Y-Y in FIG. 2(a);

FIGS. 15(a) and 15(b) show a structure of an essential part of a microminiature power converter of the prior art, in which FIG. 15(a) is a sectional view of a thin magnetic induction element mounting an IC chip thereon and FIG. 15(b) is a plan view of the thin magnetic induction element seen from the first principal plane (front surface) side.

DESCRIPTION OF SYMBOLS

Figure 1A:
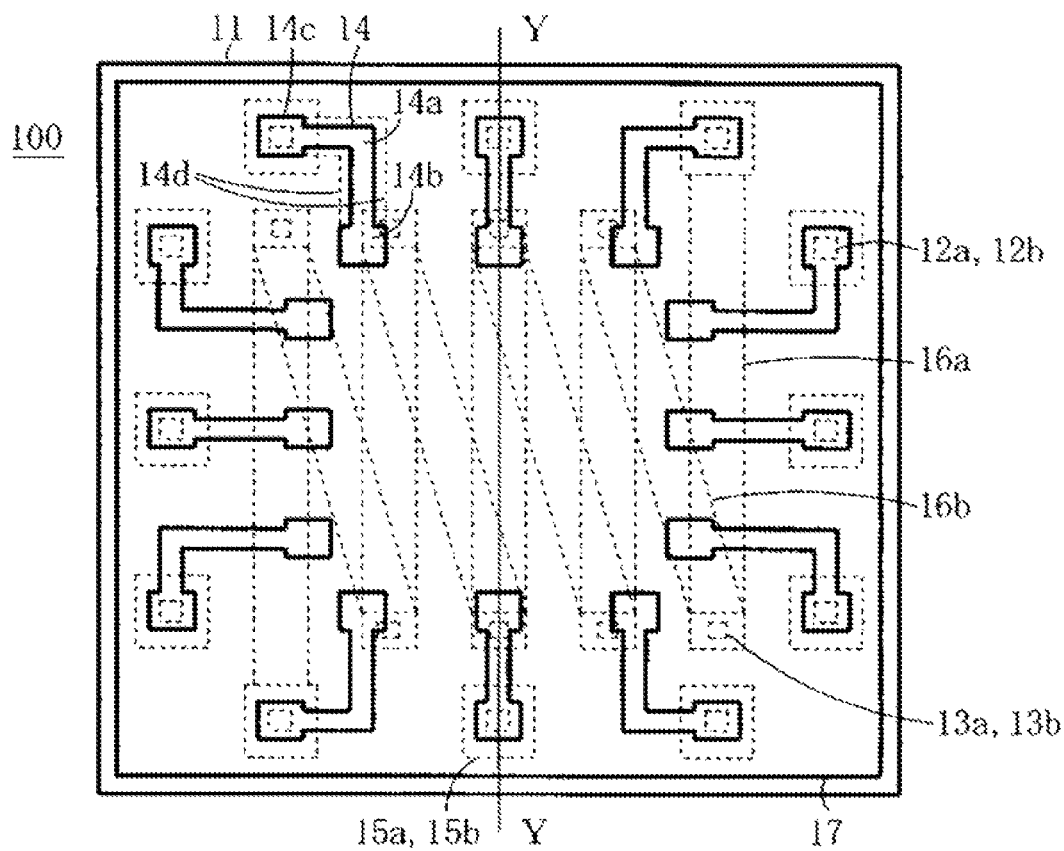

The elements illustrated in the figures are as follows: ferrite substrate 11; through-holes (electrode side) 12a; connection conductors (electrode side) 12b; through-holes (coil conductor side) 13a; connection conductor (coil conductor side) 13b; wiring 14; wiring conductor part 14a; pad electrode part 14b; connection electrode part 14c; wiring conductor part having the same width as those of the pad electrode part and the connection electrode part 14d; electrode (on the first principal plane) 15a; electrode (on the second principal plane) 15b; coil conductor (on the first principal plane) 16a; coil conductor (on the second principal plane) 16b; insulator layer 17; protective layer 18; semiconductor element 21; stud bump 22; under fill resin 23; plating seed layer 31; resist pattern 32, 36; opening 33; conductive layer 34; conductive film 35; and thin magnetic induction element 100, 200.

DETAILED DESCRIPTION OF THE INVENTION

Some preferred embodiments of the invention will be described in the following.

EXAMPLE 1

Figure 1B:
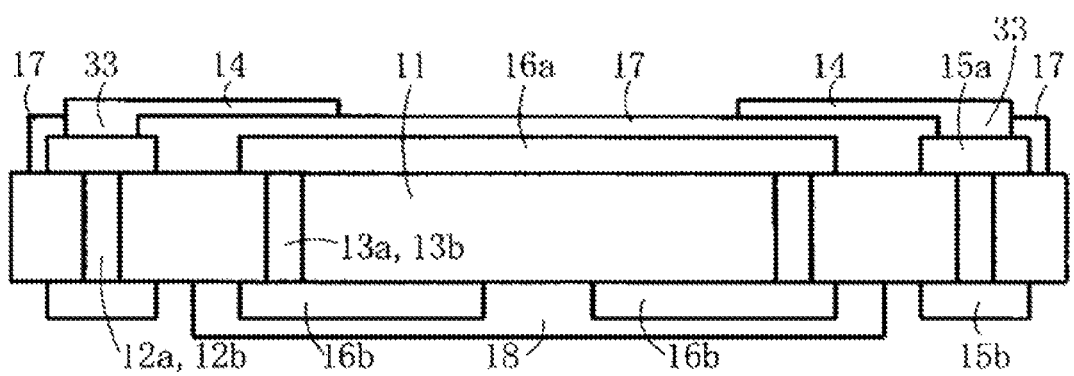
Figure 2A:
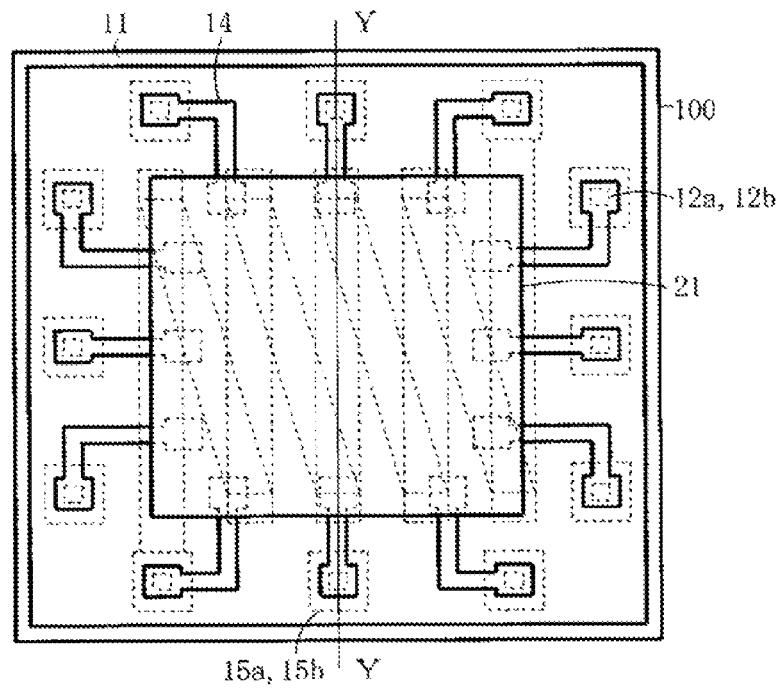
Figure 2B:
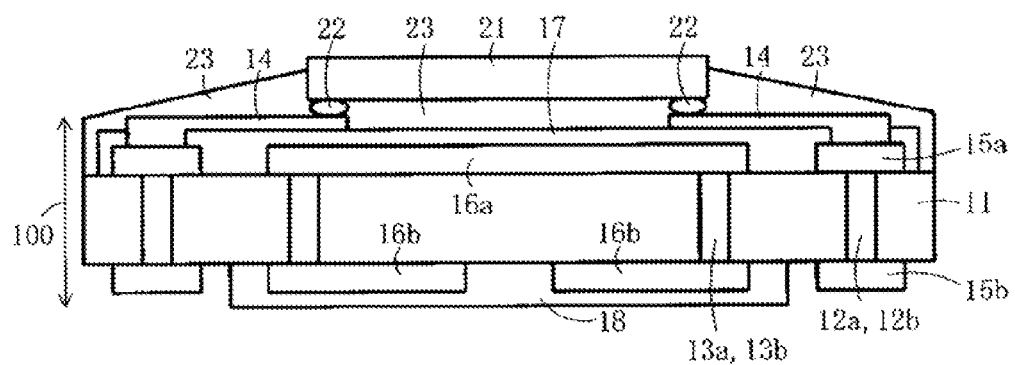

FIGS. 1(a),1(b) and 2(a), 2(b) show a structure of a microminiature power converter of a first embodiment (Example 1) of the invention, in which FIG. 1(a) is a plan view of a thin magnetic induction element seen from a first principal plane side (front side), FIG. 1(b) is a sectional view taken along the line Y-Y in FIG. 1(a), FIG. 2(a) is a plan view of a thin magnetic induction element on which a semiconductor element is packaged in a planar configuration, and FIG. 2(b) is a sectional view taken along the line Y-Y in FIG. 2(a). The semiconductor element 21 in FIGS. 2(a) and 2(b) is, for example, a power supply IC integrating a power supply controller section.

In the construction of the thin magnetic induction element 100, through-holes 12a and 13a are formed in a magnetic insulating substrate 11. Coil conductors 16a, 16b and electrodes 15a, 15b are formed on a first principal plane (front surface) and a second principal plane (rear surface) of the magnetic insulating substrate 11. The coil conductors 16a and 16b are connected by connection conductors 13b formed in through-holes 13a, and the electrodes 15a and 15b are connected by connection conductors 12b formed in through-holes 12a. An insulator layer 17 is formed on the coil conductors 16a on the first principal plane. Opening 33 are formed in the insulator layer 17 on electrodes 15a on the first principal plane, and through the openings 33, wiring 14 which is electrically connected to electrodes 15aare formed on the insulator layer 17. Each wiring 14 includes a wiring conductor part 14a, a pad electrode part 14b, and a connection electrode part 14c. The connection electrode part 14c is connected to an electrode 15a, and the pad electrode part 14b is connected to an electrode (i.e., pad electrode, not shown in these figures) formed at the semiconductor element 21 and works as a packaging electrode. Consequently, the pad electrodes 14b must be arranged in accordance with the arrangement of electrodes (pad electrodes) formed at the semiconductor element 21. The wiring 14 can have the same width in all the wiring conductor part 14a, the pad electrode part 14b, and the connection electrode part 14c as indicated by the dotted line 14d. In that case too, the parts of the wiring 14 corresponding to the pad electrode parts 14b must be arranged in accordance with the electrodes formed at the semiconductor element 21.

The reference numeral 18 on the second principal plane of magnetic insulating substrate 11 designates a protective film for the coil conductors 16b.

In this structure of the embodiment of the invention, the size (chip size) of the semiconductor element 21 and the positioning of electrodes of the semiconductor element 21 can be set freely regardless of the size of the thin magnetic induction element 100 and the positioning of the electrodes 15a. Consequently, the semiconductor element 21 can be minimized without regard to the size of the thin magnetic induction element 100 (the size of the ferrite substrate 11). The reduction of the size of the semiconductor element 21 brings about a cost reduction of a microminiature power converter.

FIGS. 3 through 12 are sectional views illustrating the steps of fabricating a thin magnetic induction element 100 of FIGS. 1(a) and 1(b) shown in the order of the process sequence. The FIGS. 3 through 12 are sectional views corresponding to the sectional view of FIG. 1(b). FIGS. 3 through 12 illustrate an enlarged portion of one chip of thin magnetic induction element. In actual fabrication process, however, a multiple of such chips of thin magnetic induction elements are formed on a large ferrite substrate 11, which is cut along scribe lines (not shown) to form a multiple of thin magnetic induction elements 100. Details of the fabrication process are described in the following.

A Ni—Zr ferrite substrate 11 having a thickness of 525 μm was used for a magnetic insulating substrate. The thickness of the ferrite substrate 11 was determined from the required inductance, the coil current value, and the characteristics of the ferrite substrate 11 as a magnetic insulating substrate, but is not limited to the thickness of this embodiment. The magnetic insulating substrate can be composed of any material as long as it is a substance which is insulating and magnetic. The ferrite substrate 11 was used in this embodiment because it could be easily molded into a substrate shape.

Figure 3:
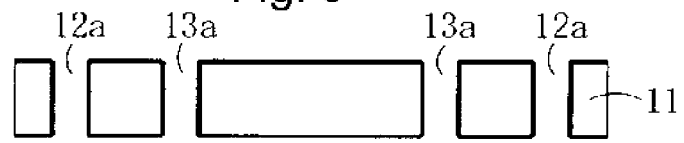
FIG. 3 is a sectional view showing one fabrication step for forming the thin magnetic induction element 100 of FIGS. 1(a) and 1(b)

First, through-holes 12a, 13a are formed in the ferrite substrate 11 as shown in FIG. 3. Each through-hole 12a is used for electrically connecting an electrode 15a formed on the first principal plane and an electrode 15b formed on the second principal plane. Each through-hole 13a is used for electrically connecting a coil conductor 16a on the first principal plane and a coil conductor 16b on the second principal plane. Any machining method can be applied including laser machining, sand blast machining, electric discharge machining, ultrasonic machining, and mechanical machining, and is determined considering machining cost, machining dimensions and the like. In this embodiment, the sand blast machining method was employed since the minimum machining width dimension of the through-holes 12a and 13a was as minute as 0.13 mm and many places needed to be machined.

Then, formed at the same time are connection conductors 12b, 13b in the through-holes 12a, 13a, and coil conductors 16a, 16b and electrodes 15a, 15b on the first principal plane and the second principal plane of the ferrite substrate 11. The details for forming them will be described in the following.

Figure 4:
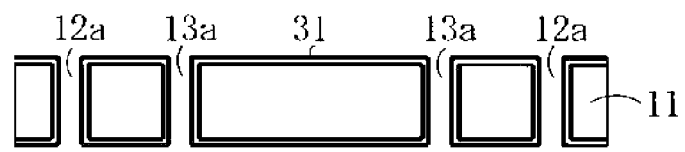
FIG. 4 is a sectional view showing a fabrication step following the step of FIG. 3 for forming the thin magnetic induction element 100 of FIGS. 1(a) and 1(b)

In order to impart conductivity to the whole surface of the ferrite substrate 11, a film of Cr/Cu was deposited by a sputtering method to form a plating seed layer 31 (FIG. 4). At this time, conductivity was imparted to the walls of the through-holes 12a, 13a as well, which may be carried out by electroless plating, if necessary. In addition to the sputtering method, a vacuum evaporation method, a CVD (chemical vapor deposition) method or the like can also be employed. The layer may be formed solely by an electroless plating method. Any method used is desired to give sufficient adhesiveness with the ferrite substrate 11. Any conductive material can be used as long as it exhibits appropriate electrical conductivity. Although chromium was used for the adhesive layer to obtain adhesiveness in this embodiment, Ti, W, Nb, Ta and the like can be used as well. Although copper was used for the seed layer 31 on which a plating layer is formed in the subsequent electroplating process, nickel or gold can be used as well. In this embodiment, the film composition of Cr/Cu was used in view of ease of machining in a subsequent process.

Figure 5:
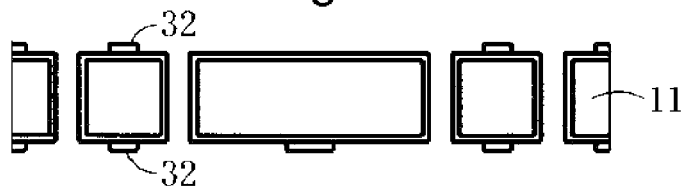
FIG. 5 is a sectional view showing a fabrication step following the step of FIG. 4 for forming the thin magnetic induction element 100 of FIGS. 1(a) and 1(b)

Then, a pattern for forming coil conductors 16a, 16b and electrodes 15a, 15b on the first and second principal planes was formed using photoresist. In this embodiment, a negative film type photoresist was used for forming the resist pattern 32 (FIG. 5).

Figure 6:
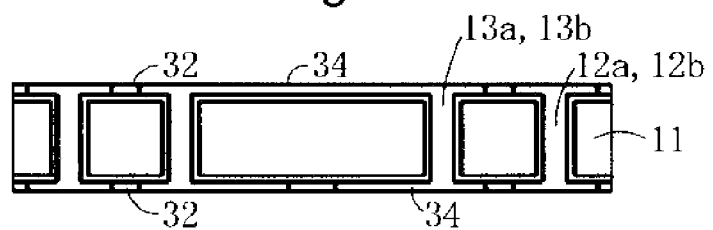
FIG. 6 is a sectional view showing a fabrication step following the step of FIG. 5 for forming the thin magnetic induction element 100 of FIGS. 1(a) and 1(b)
Figure 7:
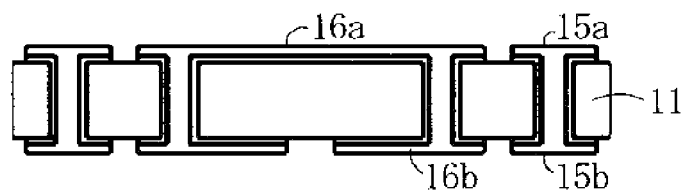
FIG. 7 is a sectional view showing a fabrication step following the step of FIG. 6 for forming the thin magnetic induction element 100 of FIGS. 1(a) and 1(b)

Then, a copper layer that is a conductive layer 34 was formed at the openings of the resist pattern 32 by electroplating (FIG. 6). The copper is also plated in the through-holes 12a, 13a in this process to form connection conductors 12b, 13b at the same time. The connection conductors 13b connect the coil conductors 16a and 16b on the first and second principal planes to form a solenoid coil. The electrodes 15a and 15b were formed at the same time and were connected by the connection conductor 12b. After electroplating, the resist pattern 32 was removed and then, unnecessary plating seed layer 31 was removed to obtain desired coil conductors 16a, 16b and electrodes 15a, 15b (FIG. 7).

Figure 8:
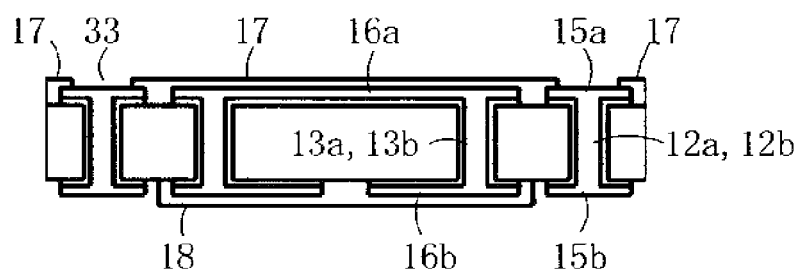
FIG. 8 is a sectional view showing a fabrication step following the step of FIG. 7 for forming the thin magnetic induction element 100 of FIGS. 1(a) and 1(b)

Then, an insulator layer 17 was formed on the first principal plane on which coil conductors 16a are formed such that the electrode 15a is partially exposed. Then, a protective film 18 was formed on the second principal plane on which coil conductors 16b are formed excepting the places for electrodes 15b (FIG. 8). In this embodiment, a photosensitive insulating material of a film type was used for the insulator layer 17 and the protective film 18. The insulator layer 17 is an interlayer insulator film performing electrical insulation between the coil conductors 16a and the wiring 14 (a wiring pattern) that is formed over the coil conductors 16a. The protective layer 18 protects the coil conductors 16b on the second principal plane. The insulator layer 17 and the protective film 18 work to fill the internal cavity of the through-holes 12a, 13a. In order to thoroughly fill the depression generated between the coil conductors 16a, 16b, which have a complicated irregular structure, and to fill the internal space of the through-holes 12a, 13a without leaving any void, a vacuum lamination method was used.

Since the insulator layer 17 and the protective film 18 are photosensitive, the exposure and development were conducted as for the usual photoresist, and openings 33 are formed in the insulator layer 17 at the same time. The photosensitive insulating material used, which was of a thermosetting type, was thermally cured at 180° C. after the photochemical machining. A formation method of the insulator layer 17 and the protective film 18 is not limited to employing the film type material, but a liquid type insulating material can be patterned by screen printing and thermally cured.

Figure 9:
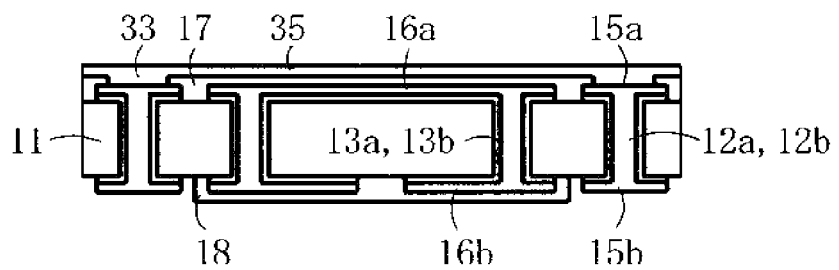
FIG. 9 is a sectional view showing a fabrication step following the step of FIG. 8 for forming the thin magnetic induction element 100 of FIGS. 1(a) and 1(b)
Figure 10:
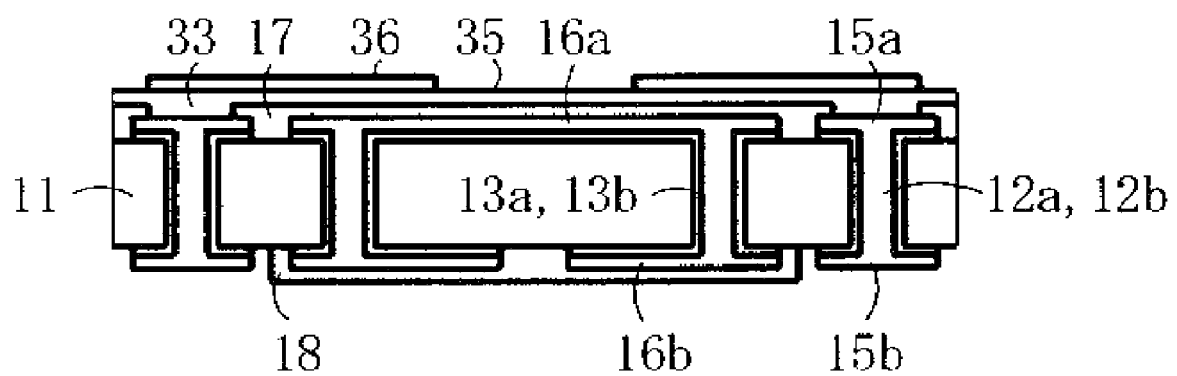
FIG. 10 is a sectional view showing a fabrication step following the step of FIG. 9 for forming the thin magnetic induction element 100 of FIGS. 1(a) and 1(b)

Then, a conductive film 35 of an aluminum film 1 μm thick was deposited on the insulator layer 17 by a sputtering method (FIG. 9). Other methods, such as an evaporation method or a CVD method, can also be employed in addition to the sputtering method that was used in this embodiment. However, a method must be selected that gives sufficient adhesiveness with the electrode 15a on the first principal plane. In order to obtain adhesiveness, an adhesive layer can be deposited under the conductive film 35 as necessary. In this embodiment, chromium 0.2 μm thick was deposited under the conductive film 35 of an aluminum film to improve adhesiveness. If the wiring resistance affects performance, the thickness of the conductive film 35 of aluminum has to be increased in the deposition process by sputtering or employing a plating method. A material other than aluminum can be used for the conductive film 35 (a wiring material), and selected from materials suited to the subsequent process of connecting to the semiconductor element 21, yet considering a machining process of the wiring 14. In this embodiment, aluminum was selected since an ultrasonic bonding method was employed.

Figure 11:
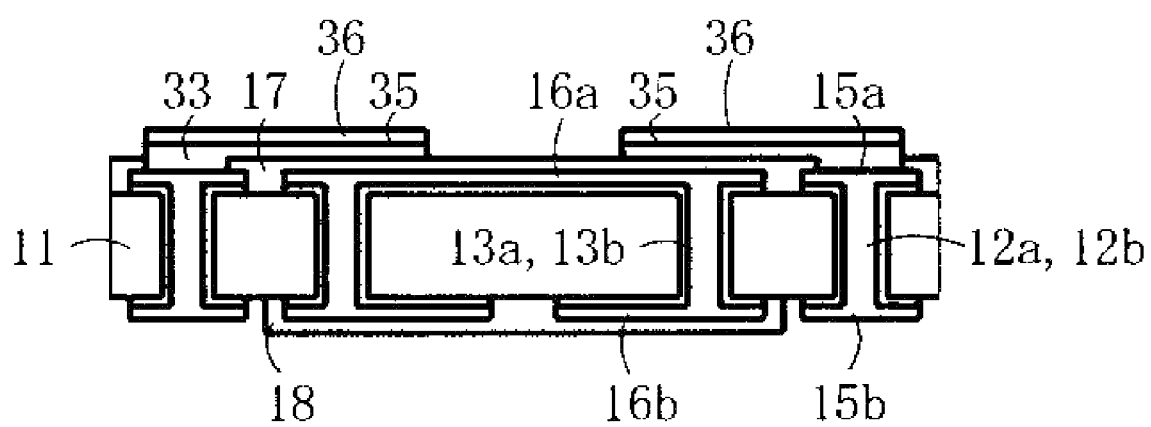
FIG. 11 is a sectional view showing a fabrication step following the step of FIG. 10 for forming the thin magnetic induction element 100 of FIGS. 1(a) and 1(b)
Figure 12:
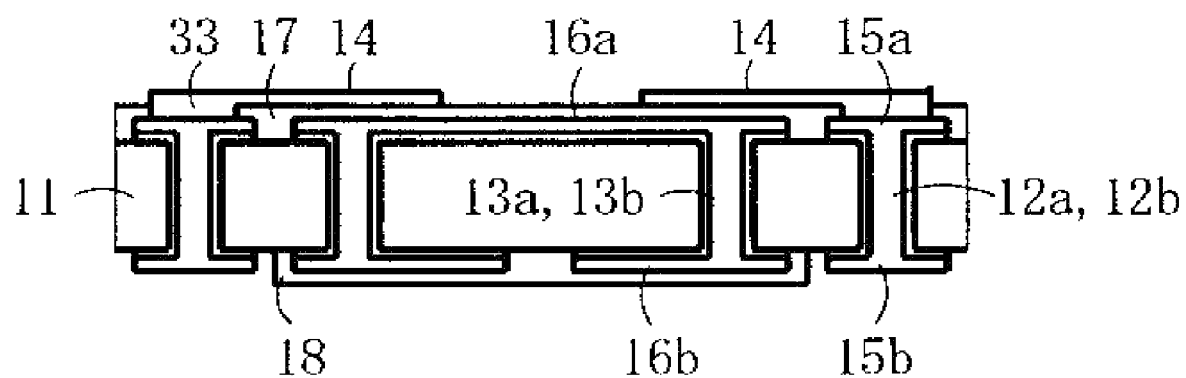
FIG. 12 is a sectional view showing a fabrication step following the step of FIG. 11 for forming the thin magnetic induction element 100 of FIGS. 1(a) and 1(b)

Then, a resist pattern 36 was formed for machining the conductive film 35 (FIG. 10), followed by wet etching to machine the conductive film 35 into a desired shape (FIG. 11). Then, the resist was removed to form a wiring 14 of a thin magnetic induction element 100 (FIG. 12).

Thru the above-described steps, a thin magnetic induction element 100 was fabricated. After that, as shown in FIGS. 2(a) and 2(b), a semiconductor element 21 was connected by an ultrasonic bonding method using a stud bump 22, and a space between the semiconductor element 21 and the thin magnetic induction element 100 was filled and sealed with an under fill resin 23. Connecting a capacitor and other components (not shown in the figures) completed the microminiature power converter. Although the connection was carried out using the stud bump 22 and ultrasonic bonding in this embodiment, the connection method is not limited to this technique, and solder bonding and a conductive bonding material can be used without any problem. Although the under fill resin 23 was used to fix the semiconductor element 21 on the thin magnetic induction element 100, the material can be selected according to the requirement, and a sealing material such as an epoxy resin can also be used.

Figure 15A:
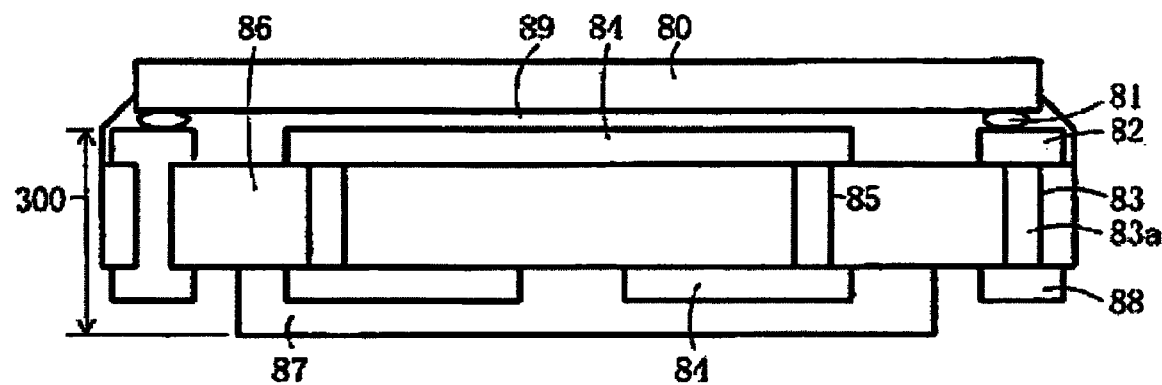
Figure 15B:
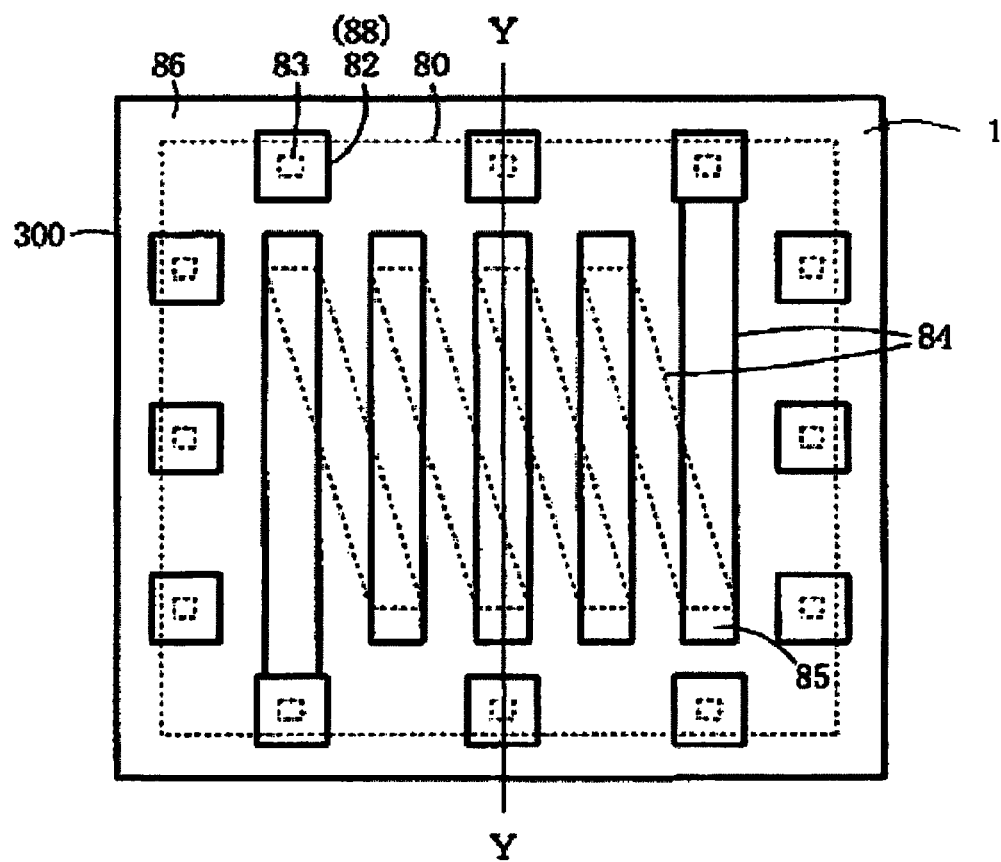

The thin magnetic induction element used in this embodiment had an external size of 3.5 mm×3.5 mm. If a thin magnetic induction element 300 according to the prior art arrangement shown in FIG. 15 and having the same external size is used in which the electrodes 82 connecting to the semiconductor element 80 are arranged in the peripheral region, the size of the semiconductor element 80 can be decreased only down to 3.0 mm×3.0 mm. For reducing to a smaller size, the thin magnetic induction element 300 may be urged to be shrunk, but this degrades performance.

In Example 1 according to the invention, the semiconductor element 21 packaged in a planar configuration can be a small one without shrinking the thin magnetic induction element 100. Specifically, the semiconductor element 21 can be downsized to 2.0 mm×2.0 mm which is a desirable size. A cost reduction effect of the semiconductor element 21 is 4/9 (an area ratio). Thus, a remarkable cost reduction effect has been achieved.

EXAMPLE 2

Figure 13:
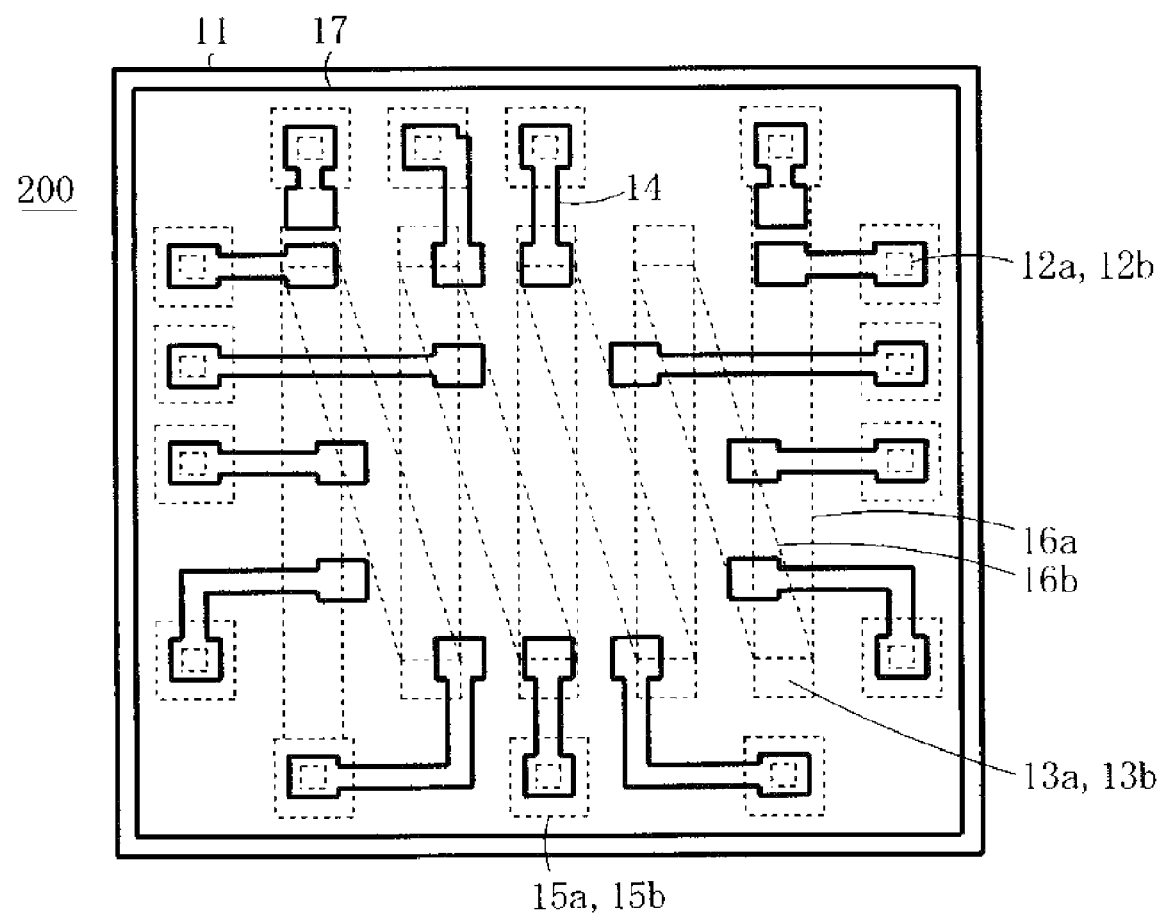
FIG. 13 shows an essential part of a microminiature power converter of a second embodiment according to the invention, and is a plan view of a thin magnetic induction element 200 seen from the first principal plane side.
Figure 14:
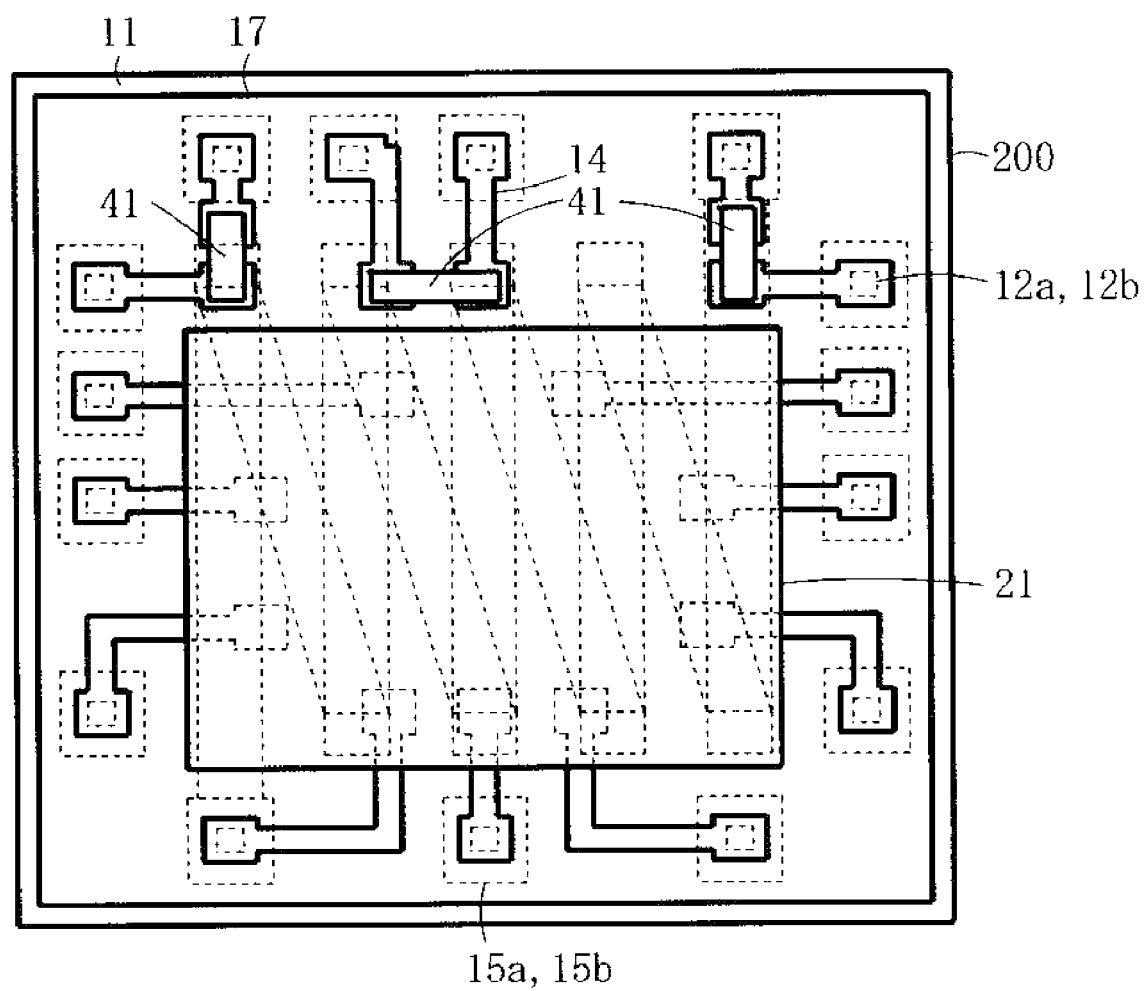
FIG. 14 is a plan view showing a semiconductor element and a capacitor packaged in a planar configuration by bonding to the wiring on the thin magnetic induction element 200 of FIG. 13.

FIGS. 13 and 14 show a structure of a microminiature power converter of a second embodiment (Example 2) according to the invention, in which FIG. 13 is a plan view of a thin magnetic induction element 200 seen from the first principal plane side, and FIG. 14 is a plan view in which a semiconductor element and capacitors are bonded to the wiring on the thin magnetic induction element 200 and packaged in a planar configuration.

Example 2 shows a planar packaging in which the components of one semiconductor element 21 and three capacitors 41 are bonded to the wiring 14 formed on the insulator layer 17 on the thin magnetic induction element 200. The number of components of course varies depending on the functions imparted to the microminiature power converter.

It has been difficult in the conventional peripheral electrode structure to package a plurality of elements having desired characteristics because of the restriction on the size of the semiconductor element to be packaged.

In the device of the invention, on the contrary, a necessary wiring is provided on the thin magnetic induction element 200 in a necessary configuration and at a necessary place. As a result, the size of the components is not restricted and the number of components can be increased. Therefore, a structure can be fabricated without any problem that includes a plurality of components as required for complicated functions.

By packaging a plurality of components including a semiconductor element 21 on a thin magnetic induction element 200 in a planar configuration, the performance of the microminiature power converter can be improved without increasing the external size of the power converter.

The coil in Examples 1 and 2 is a solenoid coil, for example. However, it should be noted that application of the present invention is not limited to a special coil shape, but can be applied to a coil having any other shape including a spiral shape.

It is understood that various other modifications will be apparent to and can be readily made by those skilled in the art without departing from the scope and spirit of the present invention. Accordingly, it is not intended that the scope of the claims appended hereto be limited to the description set forth above but rather that the claims be construed as encompassing all of the features of patentable novelty which reside in the present invention, including all features which would be treated as equivalents thereof by those skilled in the art to which the invention pertains.

What is claimed is:

1. A micro-miniature power converter, comprising:
   a. means for magnetic induction including a thin magnetic induction element comprised of:
      (1) a magnetic insulating substrate having first and second principal planes, and a plurality of through-holes defined there through;
      (2) a coil formed on a central region of the magnetic insulating substrate;
      (3) a plurality of electrodes formed on the first and second principal planes at peripheral regions of the magnetic insulating substrate, and electrically connected to the magnetic insulating substrate via the through-holes;
      (4) wiring formed on the first principal plane in the central region of the magnetic insulating substrate, one end of the wiring being connected to one electrode of the plurality of electrodes; and
      (5) an insulator layer provided between the wiring and the coil; and
   b. a plurality of components positioned in a planar arrangement on the thin magnetic induction element and comprised of:
      (i) a capacitor that is connected to the wiring; and
      (ii) a semiconductor element that is smaller than the thin magnetic induction element, that is positioned to substantially overlap the coil, and that includes a semiconductor integrated circuit formed thereon that is connected to the wiring, so that the components are packaged in the planar arrangement without restriction on positioning of the plurality of electrodes formed in the peripheral regions.

2. The micro-miniature power converter according to claim 1, wherein the coil is a solenoid coil comprised of a first conductor formed on the first principal plane, a second conductor formed on the second principal plane, and a connection conductor formed in one through-hole defined through the magnetic insulating substrate, and wherein the first conductor, the second conductor, and the connection conductor are connected to each other.

3. The micro-miniature power converter according to claim 2, wherein the plurality of components further comprise an additional semiconductor element.

4. The micro-miniature power converter according to claim 3, wherein the magnetic insulating substrate is a ferrite substrate.

5. The micro-miniature power converter according to claim 2, wherein the magnetic insulating substrate is a ferrite substrate.

6. The micro-miniature power converter according to claim 1, wherein the plurality of components further comprise an additional semiconductor element.

7. The micro-miniature power converter according to claim 6, wherein the magnetic insulating substrate is a ferrite substrate.

8. The micro-miniature power converter according to claim 1, wherein the magnetic insulating substrate is a ferrite substrate.

* * * * *